United States Patent [19]

Lindmayer

[11] 4,246,043
[45] Jan. 20, 1981

[54] YTTRIUM OXIDE ANTIREFLECTIVE COATING FOR SOLAR CELLS

[75] Inventor: Joseph Lindmayer, Bethesda, Md.

[73] Assignee: Solarex Corporation, Rockville, Md.

[21] Appl. No.: 99,821

[22] Filed: Dec. 3, 1979

[51] Int. Cl.$^3$ .............................................. H01L 31/04
[52] U.S. Cl. ..................................... 136/256; 357/52; 357/54
[58] Field of Search ................ 136/89 CC; 357/30, 52, 357/54

[56] References Cited

U.S. PATENT DOCUMENTS

| | | | |
|---|---|---|---|
| 3,457,470 | 7/1969 | Meuleman | 357/29 |
| 3,533,850 | 10/1970 | Tarneja et al. | 136/89 |
| 3,539,883 | 11/1970 | Harrison | 136/89 |
| 3,549,411 | 12/1970 | Bean et al. | 427/94 |
| 3,620,829 | 11/1971 | Beck | 136/89 |
| 3,755,015 | 8/1973 | Redington et al. | 148/188 |
| 3,904,453 | 9/1975 | Revesz et al. | 156/252 |
| 3,922,774 | 12/1975 | Lindmayer et al. | 29/572 |
| 3,977,905 | 8/1976 | Revesz et al. | 136/89 |
| 3,990,100 | 11/1976 | Mamine et al. | 357/30 |
| 4,011,578 | 3/1977 | Bollen et al. | 357/30 |
| 4,055,442 | 10/1977 | Crosher | 136/89 CC |
| 4,070,689 | 1/1978 | Coleman et al. | 357/30 |
| 4,078,945 | 3/1978 | Gonsiorawski | 136/89 CC |
| 4,156,622 | 5/1979 | Lindmayer | 136/89 CC |

FOREIGN PATENT DOCUMENTS

| | | | |
|---|---|---|---|
| 1934751 | 1/1971 | Fed. Rep. of Germany | 136/89 CC |
| 2754652 | 6/1979 | Fed. Rep. of Germany | 136/89 CC |

OTHER PUBLICATIONS

E. M. Pastink et al., "A Low Cost, Durable Anti-reflective Film for Solar Collectors", *Conf. Record, 13th IEEE Photovoltaic Specialists Conf.* (1978), pp. 620-623.
E. Y. Yang et al., "Optimum Design of Antireflection Coating for Silicon Solar Cells", *Conf. Record, 10th IEEE Photovoltaic Specialists Conf.* (1973), pp. 168-173.
J. P. Schwarz, "Improved Silicon Solar Cell Antireflective Coatings", *Conf. Record, IEEE Photovoltaic Specialists Conf.* (1970), pp. 173-175.
P. A. Iles, "Antireflection Coatings for Solar Cells", *J. Vac. Sci. Technol.*, vol. 14, pp. 1100-1105 (1977).
B. S. Verma et al., "Design of Antireflection Coatings", *Thin Solid Films*, vol. 44, pp. L9-L12 (1977).
Y. C. M. Yeh et al., "Practical Antireflection Coatings for Metal-Semiconductor Solar Cells", *J. Appl. Phys.*, vol. 47, pp. 4107-4112 (1976).
J. T. Cox et al., "Antireflection Coatings for Optical & Infrared Optical Methods", *Physics of Thin Films*, vol. 2, Academic Press (1964), pp. 239-304.
A. Atzei et al., "Improved Antireflection Coatings on Silicon Solar Cells", pp. 349-362 in Solar Cells, Gordon & Breach Publishers (1971).

*Primary Examiner*—Aaron Weisstuch
*Attorney, Agent, or Firm*—Watson, Cole, Grindle & Watson

[57] ABSTRACT

Yttrium oxide is used as an antireflective coating for photovoltaic cells.

10 Claims, No Drawings

YTTRIUM OXIDE ANTIREFLECTIVE COATING FOR SOLAR CELLS

The present invention relates generally to the art of solar or photovoltaic cells. More particularly, it refers to antireflective coatings for such cells.

Photovoltaic cells are well-known semiconductor devices for transforming light energy into usable electrical energy. Although the individual structures of the cells and chemical compositions of the host material may vary, exemplary of solar cells at the present time is a relatively thin wafer of monocrystalline or semicrystalline silicon having opposed, major surfaces that are usually substantially planar. The wafer has been doped or impregnated throughout its volume with an impurity of one conductivity type, i.e., an n or p-type impurity. Then a junction is formed by diffusing into the wafer an impurity of the conductivity type opposite to that with which the wafer has previously been doped.

As an example, if the wafer has been doped with boron, the silicon wafer will be what is known p-type. Subsequent diffusion will result in a wafer having p-n junction near one surface thereof. With such a junction established, radiant energy, usually in the form of light, will be absorbed by the silicon and generate electron-hole pairs, which consist of negatively charged electrons and positively charged holes. The electrons will be attracted to the n-type silicon; the positively charged holes will go to the p-type silicon. Conductors are positioned at opposite sides of the wafer, those conductors generally taking the form of metallic grid positioned on that surface of the cell that is to be exposed to light, and a metallic contact on the other, back surface of the wafer. As a consequence, a voltage is generated and electrical current flows, so that a photovoltaic device has been created.

The efficiency of photovoltaic devices thus formed, i.e., the power output of the device measured as a percent of its power input, is dependent on many factors. However, one important criterion in obtaining maximum output is that there be maximum absorption of light energy under any given condition of light availability. Otherwise stated, it is not possible to obtain an output of electricity that will be considered satisfactory if a sufficient portion of the available light does not enter the solar cell but instead is reflected away from the light-receiving surface of the cell.

Entrance of light into a semiconductor device is limited by the difference in indices of refraction of the medium from which the light enters the cell and that of the silicon semiconductor material, itself. The index of refraction of a silicon wafer is approximately 4.0. When light enters the silicon wafer directly from the air, it is traveling in a medium that has an index of refraction of 1. Consequently, due to the difference in the indices, approximately 35 percent of the incident light will be reflected away from the silicon cell rather than absorbed by it.

Generally, a solar cell is not used with an uncoated, major surface that is adapted to receive light impinging thereon. In space, the cell is usually covered by quartz slide to minimize proton damage; in a terrestrial setting a coating is usually applied to the light-receiving surface of the cell to protect the cell from the terrestrial environment. The index of refraction for glasses and other conventional encapsulating materials, such silicone rubber, is typically about 1.3 to 1.5. When a bare silicon solar cell is covered with glass or adhesive having an index of refraction in a range of about 1.3 to 1.5, the reflection of light from the cell is reduced, since such a coating provides an intermediate index of refraction between the high index of the silicon and the unity index of the air. However, it is still highly advisable to provide an antireflective coating for the surface of the cell that is to be exposed to light.

Research has previously been conducted, particularly in the area of solar cells that are to be used in space technology applications. Thus, of the prior art known to me in this regard, U.S. Pat. No. 3,533,850, issued October 13, 1970 to Tarneja et al., is relevant to the present invention. While that patent specifically relates to solar cells to be used in space, where a quartz cover is normally placed over the antireflective coating to protect the cell from injurious radiations, nevertheless Tarneja did disclose specific material which such a coating might be formed. He specifically identified, in order, titanium dioxide, tantalum oxide, cerium oxide, zinc sulfide and tin oxide as being materials that would provide the necessary index of refraction yet would not otherwise adversely affect operation of the solar cell.

While my most recent efforts in antireflective coatings have been primarily directed to the use of tantalum oxide as such an antireflective coating, see, e.g., U.S. Pat. Nos. 3,922,774 and 4,156,522, work has also been accomplished on the use of niobium oxide for that purpose. See, e.g., U.S. Pat. No. 3,977,905. However, there does not appear to be any pattern by means of which one can determine whether a specific oxide of a specific metal, or any other material will be a good antireflective coating for a solar cell. Thus, while tantalum and niobium are in Group V of the Periodic Table of Elements, titanium and tin are Group IV metals and zinc is a Group II metal.

The present invention is founded on the discovery that still a different compound—yttrium oxide—is a good antireflective coating for a solar cell. Elemental yttrium is a Group III metal having an atomic number of 39 and atomic weight of 88.905. The oxide of yttrium is $Y_2O_3$, which is now commercially available. While yttrium availability has increased in large part due to its use as a matrix for europium-activated yttrium phosphors utilized by the television industry, nevertheless $Y_2O_3$ is in sufficient supply to make its price competitive and its use as an antireflective coating for photovoltaic cells both effective and practical.

Yttrium oxide is deposited on the light-receiving surface of a photovoltaic cell, i.e., that surface of the cell that is near to the p-n junction of the cell, by any of several methods. My preference at this time is to effect deposition by means of electron beam evaporation by conventional apparatus and by techniques well-known to those of skill in this art. While thickness of the deposited layer of $Y_2O_3$ may vary, the preferred thickness is one-quarter of the wavelength of the most utilizable light, which is between 550 and 650 A most preferably about 600 A. As so deposited, the generally stoichiometric $Y_2O_3$ is transparent to visible light, particularly the short wavelengths thereof, and has an index of refraction of approximately 2.2 to 2.3.

My preferred embodiment of a host material for a photovoltaic cell is monocrystalline silicon, although what has been termed semicrystalline silicon, i.e., a body of silicon formed of grains of silicon of at least about one millimeter in diameter and having impurities concentrated in the grain boundaries, is rapidly becoming not only as utilitarian but far more economic in terms of cost per unit of power generated. Also preferred is an n-p cell, in which the photovoltaic junction separates a relatively thin layer of n-type silicon and a relatively thick layer of p-type silicon, the n-type silicon layer terminating in a major, front surface of the wafer, which surface is adapted to receive light impinging thereon.

Most preferred at this time is an antireflective coating consisting entirely of $Y_2O_3$, although it will be apparent that coatings having a portion of $Y_2O_3$ and also including, e.g., $Ta_2O_5$, will be useful. Thus, coatings may comprise a mixture of tantalum pentoxide and yttrium oxide, and they also may consist of layers of different oxides, such as a layer of yttrium oxide directly overlying the surface of the cell and a layer of tantalum pentoxide overlying the layer of yttrium oxide. A layer of titanium dioxide might be substituted for the layer of tantalum pentoxide.

While, as presently determined, the best mode of applying the yttrium oxide as an antireflective coating on the light-receiving surface of a photovoltaic cell is to deposit it directly, e.g., by means of electron beam evaporation, the oxide may be formed after deposition of another form of yttrium on the light-receiving surface of the cell. Thus, elemental yttrium may be deposited on that surface and, after deposition, oxidized to $Y_2O_3$, or a mixture of yttrium and yttrium oxide may be deposited and then oxidized to form yttrium oxide in its entirety. For the latter type of formation, the disclosure of my U.S. Pat. No. 4,156,622, issued May 29, 1979, may be referred to for an example of such subsequent oxidation with a mixture of elemental tantalum and tantalum pentoxide, and of the benefits of such a deposition-oxidation procedure.

It will be apparent to those of skill in this art that alterations and modifications may be made in the preferred embodiment described hereinbefore. Thus, other techniques may be used to apply $Y_2O_3$, and different depths of layers may be applied as specific conditions dictate. However, $Y_2O_3$ represents a novel and nonobvious alternative to previously known, antireflective coatings. Therefore, it is desired that all obvious alterations and modifications be deemed to fall within the purview of my invention, which is to be limited only by the scope, including equivalents, of the following, appended claims.

I claim:

1. A photovoltaic cell comprising a body of host material having a major surface adapted for the reception of light energy impinging thereon and conversion of such energy into electrical energy, and an antireflective coating on said surface, said coating containing yttrium oxide.

2. A photovoltaic cell as claimed in claim 1, in which the thickness of said antireflective coating is between about 550 and 650 A.

3. A photovoltaic cell as claimed in claim 1, in which the thickness of said antireflective coating is about 600 A.

4. A photovoltaic cell as claimed in claim 1, in which said antireflective coating consists entirely of yttrium oxide.

5. A photovoltaic cell as claimed in claim 1, in which said host material is monocrystalline silicon.

6. A photovoltaic cell as claimed in claim 1, in which said host material is semicrystalline silicon.

7. A photovoltaic cell as claimed in claim 1, in which said coating also contains tantalum pentoxide.

8. A photovoltaic cell as claimed in claim 1, in which said coating is overlaid by another antireflective coating containing tantalum pentoxide.

9. A photovoltaic cell as claimed in claim 1, in which said coating is formed by depositing elemental yttrium on said surface and then oxidizing said yttrium.

10. A photovoltaic cell as claimed in claim 1, in which said coating is formed by depositing a mixture of elemental yttrium and yttrium oxide on said surface and then oxidizing said mixture.

* * * * *